US005896576A

United States Patent [19]

Walley et al.

[11] Patent Number: 5,896,576

[45] Date of Patent: Apr. 20, 1999

[54] AUDIO MUTE FOR DIGITAL CORDLESS TELEPHONE

[75] Inventors: John S. Walley, Lake Forest; Stephen C. Muller, San Diego; Kenneth E. Garey, Irvine, all of Calif.

[73] Assignee: Rockwell International Corporation, Newport Beach, Calif.

[21] Appl. No.: 08/568,049

[22] Filed: Dec. 6, 1995

[51] Int. Cl.[6] .......... H04Q 7/32

[52] U.S. Cl. .......... 455/570; 375/254

[58] Field of Search .......... 375/224, 245, 375/254, 285, 346, 351; 455/67.3, 219, 222, 232.1, 296, 501, 550, 570, 462; 381/94.5, 107, 56

[56] References Cited

U.S. PATENT DOCUMENTS

| | | | |
|---|---|---|---|
| 4,481,640 | 11/1984 | Chow et al. | 375/1 |
| 4,724,435 | 2/1988 | Moses et al. | 340/870 |
| 4,804,938 | 2/1989 | Rouse et al. | 340/310 |
| 4,926,485 | 5/1990 | Yamashita | 381/107 |
| 5,042,050 | 8/1991 | Owen | 375/1 |
| 5,077,753 | 12/1991 | Grau, Jr. et al. | 375/1 |
| 5,103,459 | 4/1992 | Gilhousen et al. | 375/1 |
| 5,150,377 | 9/1992 | Vannucci | 375/1 |
| 5,280,472 | 1/1994 | Gilhousen | 370/18 |
| 5,299,233 | 3/1994 | Asghar et al. | 455/296 |
| 5,309,443 | 5/1994 | Schorman | 455/67.3 X |
| 5,309,474 | 5/1994 | Gilhousen et al. | 375/1 |
| 5,351,270 | 9/1994 | Graham et al. | 375/1 |
| 5,375,140 | 12/1994 | Bustamante et al. | 375/1 |
| 5,408,693 | 4/1995 | Alton et al. | 455/226.2 |
| 5,416,797 | 5/1995 | Gilhousen et al. | 375/705 |
| 5,483,690 | 1/1996 | Schroder | 455/222 |
| 5,615,412 | 3/1997 | Doran | 375/351 |
| 5,687,189 | 11/1997 | Smith et al. | 375/244 |

*Primary Examiner*—Dwayne D. Bost
*Assistant Examiner*—William G. Trost
*Attorney, Agent, or Firm*—James P. O'Shaughnessy; William C. Cray

[57] ABSTRACT

A signal indicating the quality of the received digital data in an ADPCM cordless telephone system is monitored and a transition from good to poor quality is detected. In response to this detection, a first attenuation level is applied to the received signal, the level being selected to maintain the intelligibility of the signal to the user while lowering the volume thereof. The first attenuation level is then reduced such that reduced attenuation is maintained over a time interval selected to accommodate for the known error propagation time of the ADPCM signal. An optional clipping circuit may be employed to limit the excursion of the output audio signal.

15 Claims, 1 Drawing Sheet

AUDIO MUTE FOR DIGITAL CORDLESS TELEPHONE

BACKGROUND OF THE INVENTION

1. Field of the Invention

The subject invention relates generally to communication apparatus and, more particularly, to an improved audio mute method and apparatus for a digital cordless telephone.

2. Description of Related Art

Analog cordless telephones are known in the prior art. While the voice quality of such telephones degrades relatively rapidly with distance, they have a noise response which exhibits a relatively gradual cumulative degradation of the signal. While digital cordless telephones utilizing spread spectrum techniques promise much improved voice quality and range, the noise response of such systems is abrupt, annoying to the user, and can exhibit large "booms."

Proposals for reducing such abrupt noise effects have included a simple algorithm according to which the output signal to the user is simply turned off when the channel is known to be bad; i.e. a simple switch. Other approaches use complex algorithms which look for "non" speech-like audio signals that occur when the channel goes bad and perform complex audio signal conditioning to reduce audio artifacts. The first approach is undesirable because the telephone user experiences a complete "dropout" or interruption of the voice to which he is listening. The second approach is undesirable because of high complexity and expense.

OBJECTS AND SUMMARY OF THE INVENTION

It is therefore an object of the invention to improve telephone communication systems;

It is another object of the invention to improve cordless telephone communication systems;

It is another object to provide an improved audio mute technique for digital cordless telephones;

It is another object to provide such a technique which is relatively simple to implement and yet yields improved effectiveness over "simple switch" techniques;

It is another object to provide an audio mute technique which avoids complete dropout or interruption of the voice or other signal provided to the telephone user; and It is another object of the invention to provide an audio mute technique for digital cordless systems which is particularly applicable to adaptive delta pulse code modulation (ADPCM) techniques.

According to the invention a signal indicating the quality of the received data is monitored and a transition from good to poor quality is detected. In response to this detection, a first attenuation level is applied to the received signal selected to maintain the intelligibility of the signal to the user while lowering the volume thereof. This attenuation level is then reduced to at least a second level. This second level is preferably maintained over a selected time to accommodate for the known error propagation time of the ADPCM signal. An additional useful feature according to another aspect of the invention is the implementation of a clipping circuit to limit the excursion of the audio signal. This clipping circuit is again put into operation upon detection of poor data quality and may last for the duration of the error propagation time.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, of which:

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide a particularly useful and readily implementable monitoring circuit for an ADPCM digital cordless telephone system.

Figure 1:
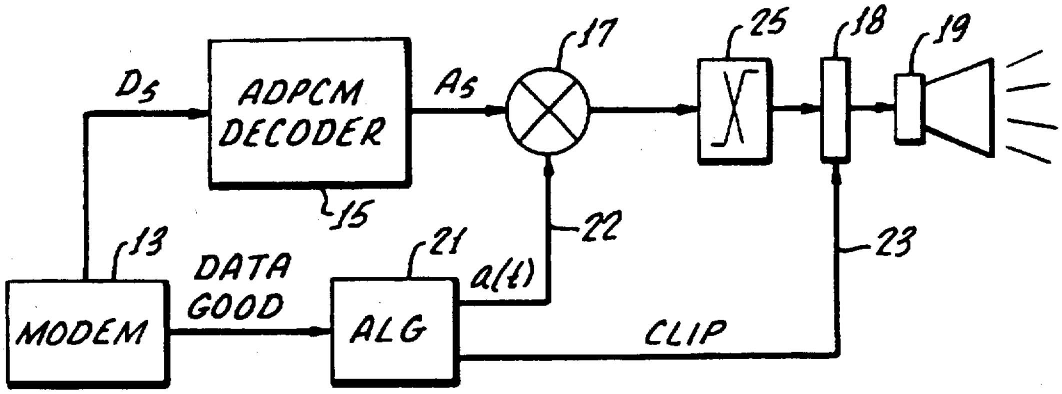
FIG. 1 is a circuit block diagram of a monitoring system according to the preferred embodiment.

The preferred embodiment muting system 11 is illustrated in FIG. 1. This system is particularly adapted for use in a wireless voice transmission system employing conventional adaptive delta pulse code modulation (ADPCM). As known to those skilled in the art, this modulation scheme exhibits memory, such that the effect of the occurrence of a bit error lasts for a period of time and therefore requires a period of time to propagate out of the system. Such systems typically employ modems such as the modem 13 of FIG. 1, which provides an indicator or flag indicating that the received data is of good quality or not.

FIG. 1 further illustrates an ADPCM decoder 15 which receives a digital baseband ADPCM signal $D_s$ from the modem 13 and produces a digital representation of an analog signal denoted $A_s$. The signal $A_s$ may then be converted to an analog signal by a digital-to-analog converter 18 and then to an audio output signal by a speaker 19. The decoder 15, converter 18, and speaker 19 are typical components of conventional ADPCM systems and their design and use is well-known to those skilled in the art. In particular, the decoder 15 may provide an output which is a 16-bit value representing the analog value of the signal at discrete times.

According to the preferred embodiment, a multiplier 17 is inserted into the signal path between the decoder 15 and the audio output device 19. The multiplier 17 is arranged to multiply the signal $A_s$ by a factor a(t). The factor a(t) is provided over a signal line 22 by an algorithm generator 21.

The algorithm generator 21 may further optionally provide a CLIP signal over a signal line 23 to a clipping circuit 25. The clipping circuit 25 per se is conventional and of a design well-known to those skilled in the art. The clipping circuit 25, when employed, serves to limit the maximum excursion of the audio signal to within selected limits for audio volume limit control. It may be noted that the D/A converter 18 can be located elsewhere in the signal path between the decoder 15 and the speaker 19, for example, between the decoder 15 and the multiplier 17.

Figure 2:
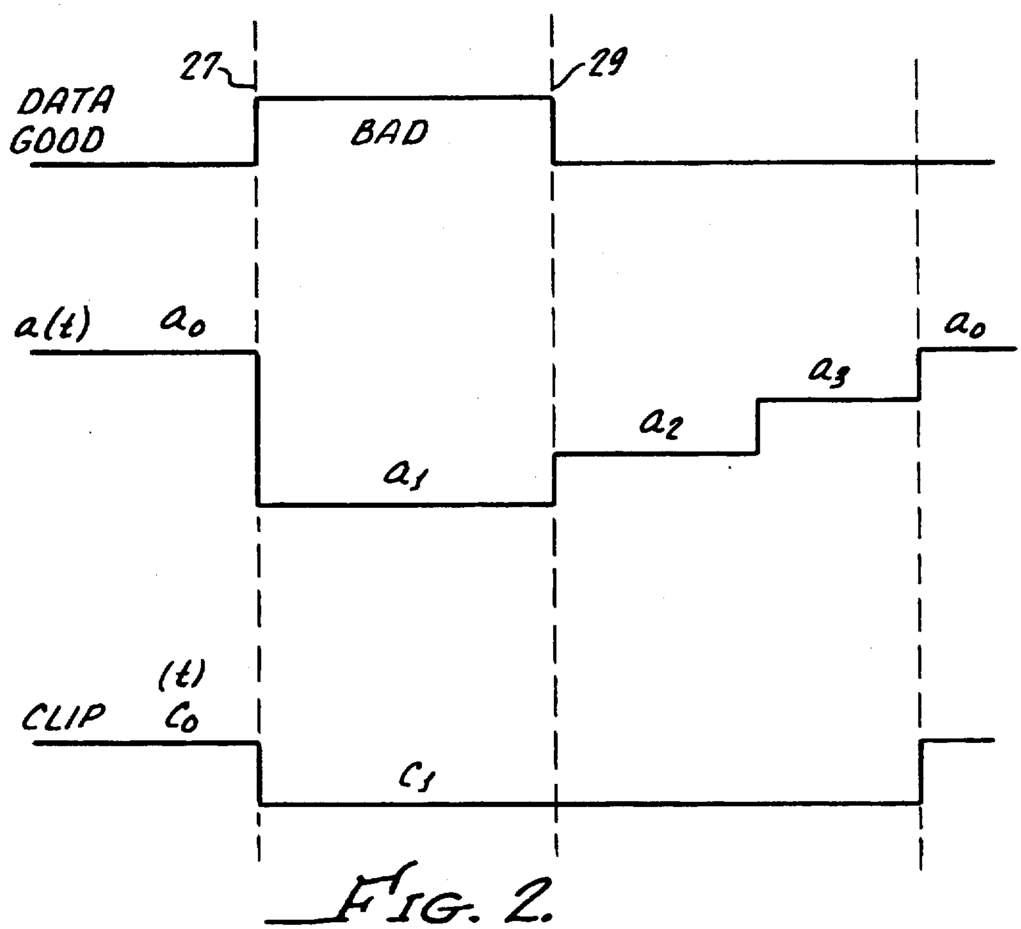
FIG. 2 is a timing diagram further illustrative of the structure and operation of the preferred embodiment.

The a(t) signal and CLIP signal are illustrated in FIG. 2 with respect to the DATA GOOD signal. As shown, when the DATA GOOD signal rises at 27, indicating data quality is poor, a maximum attenuation level $a_1$ is applied by the algorithm generator 21 to lower the signal level. At the same time, the CLIP signal may be applied by the algorithm generator 21 to limit the maximum excursions of the signal, if the CLIP option is employed.

After the DATA GOOD signal drops back to "good" quality at 29, the attenuation signal a(t) ramps or steps back up to "less" attenuation. FIG. 2 particularly illustrates two step-ups of the attenuation level to respective attenuation levels $a_2$ and $a_3$ and then to zero attenuation or normal signal level $a_0$. This step-up of attenuation factors accommodates the memory and error propagation period inherent in ADPCM systems. The period of data corruption or error propagation is a known characteristic of any particular ADPCM system.

Two or more attenuation levels, e.g. $a_1$, $a_2$, may be used. Typical attenuation values are $a_1 \cong 30$ dB, $a_2 \cong 20$ dB, $a_3 \cong 6$ dB. Attenuation level $a_1$ is applied as long as the channel is bad, while the other attenuation levels $a_2$, $a_3$ may be applied for durations of 4–8 milliseconds (ms) and 50 ms, respectively. The CLIP signal is preferably employed to improve limiting during the entire time attenuation is applied, as shown in FIG. 2.

The algorithm illustrated in FIG. 2 can be implemented in software or hardware, using, for example, a programmed digital processor or discrete componentry or a combination thereof. In one software embodiment, a micro-controller implements the algorithm generator 21. In such an embodiment, the micro-controller reads the "DATA GOOD" indication of the modem 13 and, upon a transition from good to poor signal quality, extracts the a(t) contour from memory and imposes it on the output of the decoder 15. The a(t) contour may be so imposed by employing a multiplier 17 already used for volume control in typical circuits.

In operation, application of the a(t) signal weakens or lowers the volume of the signal heard by the user, while avoiding a complete dropout. This operation has been found to be more pleasing to the user than complete dropout of the signal. Intelligibility and generated noise during a dropout is thus maintained at comfortable listening levels. In addition, application of the a(t) contour is straight-forwardly implementable with a minimum of, or no additional, componentry.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A method of muting an ADPCM digital telephone signal comprising the steps of:

detecting a data quality signal indicating data quality has transitioned from good to poor;

applying a first attenuation level of a first fixed value to a decoded form of the received signal upon initial detection of each and every transition from good to poor in said data quality signal, said first fixed value being selected to maintain intelligibility of the received signal while reducing the volume thereof, said first fixed value being applied to said decoded form of said received signal for as long as said data quality signal indicates that data quality is poor;

detecting a transition in said data quality signal from poor to good; and responding to the detection of a transition in said data quality signal from poor to good by decreasing the attenuation level applied to the decoded form of the received signal to at least a second fixed value and continuing to attenuate the decoded form of the received signal over a period of time selected to account for the known error propagation time of the ADPCM signal.

2. The method of claim 1 wherein the attenuation level applied to the decoded form of said received signal is maintained at said second value for a first time period and then changed to a third value, said third value being maintained for a third time period, said third value resulting in a lesser attenuation than said second value.

3. The method of claim 2 wherein said first value is 30 dB and said second and third values are 20 dB and 6 dB, respectively.

4. The method of claim 3 wherein said second and third values are maintained for 4–8 milliseconds and 50 milliseconds, respectively.

5. Digital cordless telephone circuitry providing an output audible signal to a user and comprising:

means for providing a data quality signal indicating a transition from good to poor signal quality of a received signal and a transition back from poor signal quality to good signal quality;

a decoder means for receiving a version of said received signal and providing a decoded output signal; and means for detecting a transition from good to poor in said data quality signal and, in response to each and every transition from good to poor in said data quality signal, multiplying the output signal of said decoder means by a first attenuation signal of a first fixed value selected to maintain intelligibility of the output audible signal to the user while maintaining the audio listening level thereof, said means for detecting and multiplying further being responsive to a transition in said data quality signal from poor to good to multiply said output signal by at least a second attenuation signal of a value selected to result in less attenuation of said output signal than said first value.

6. The circuitry of claim 5 further including means for clipping the attenuated signal to limit the maximum excursion of the output audible signal.

7. The circuitry of claim 6 wherein said means for clipping clips said signal upon detection of a said transition.

8. The circuitry of claim 5 wherein said means for detecting and multiplying comprises a programmed digital processor having means for storing said first fixed value and the value of said second attenuation signal.

9. The circuitry of claim 8 wherein said decoder means outputs a series of digital signals representing an analog value at each of a plurality of respective discrete times and wherein said programmed digital processor means multiplies each said discrete signal by a selected one of said first fixed value and the value of said second attenuation signal.

10. The circuitry of claim 9 wherein the value of said second attenuation signal is maintained at a first fixed level for a first time period and then stepped up to a third fixed level, said third fixed level being maintained for a third time period.

11. The circuitry of claim 10 wherein said first value is 30 dB and said second and third values are 20 dB and 6 dB, respectively.

12. The circuitry of claim 11 wherein said first fixed value is maintained for as long as data quality is indicated to be poor.

13. The circuitry of claim 10 wherein said second attenuation signal is applied for a period of time selected to account for the known error propagation time of the received signal.

14. The circuitry of claim 5 wherein said first fixed value is applied for as long as said data quality signal indicates that data quality is poor.

15. The circuitry of claim 14 wherein said second attenuation signal is applied for a period of time selected to account for the known error propagation time of the received signal.

* * * * *